Feb. 14, 1961 J. C. COYKENDALL 2,972,048
ULTRA-HIGH FREQUENCY CONVERTER
Filed Dec. 19, 1958
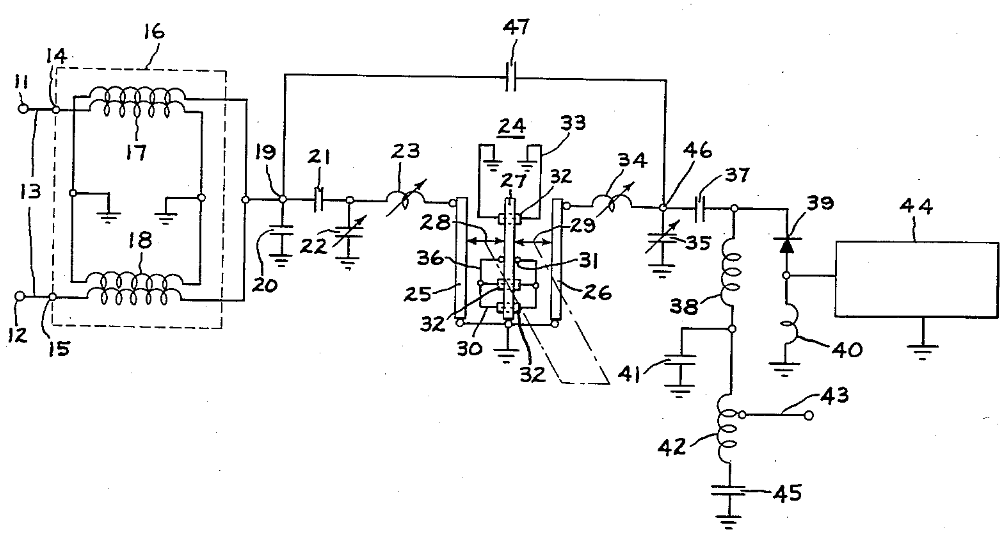
INVENTOR.
JOHN C. COYKENDALL
BY Joseph Levinson
HIS ATTORNEY

United States Patent Office 2,972,048
Patented Feb. 14, 1961

2,972,048

ULTRA-HIGH FREQUENCY CONVERTER

John C. Coykendall, Syracuse, N.Y., assignor to General Electric Company, a corporation of New York Filed Dec. 19, 1958, Ser. No. 781,532

1 Claim. (Cl. 250—20)

This invention relates to an improved ultra-high frequency converter.

In an application, Serial No. 762,445, now Patent No. 2,921,189, which was assigned to the assignee of this application, an ultra-high frequency (UHF) converter is described in which local oscillator radiation is reduced. This is accomplished by coupling a neutralizing circuit between input and output of the double-tuned preselector of the UHF converter, the output being coupled to one side of a crystal for feeding back an out-of-phase voltage from the crystal to the input of the preselector thereby neutralizing the circuit for the local oscillator frequency. However, it has been found in some cases that although local oscillator radiation is reduced in a varying degree over the desired band, intermediate frequency (IF) rejection is reduced.

Undesired intermediate frequencies (IF) appear on the antenna, and if these IF signals are applied to the IF stages of the television receiver, interference results. IF rejection then relates to the ability of the converter to reject undesired IF signals, and supply only the desired IF signals to the IF stages of the receiver. The double-tuned preselector stage is very effective for rejecting undesired IF signals. In utilizing the neutralizing circuit of the aforesaid application, however, some undesired IF signals may be coupled around the preselector to the IF stages of the receiver.

Accordingly, it is an object of this invention to provide a UHF converter having reduced local oscillator radiation and good IF rejection characteristics.

This is accomplished by this invention by connecting a neutralizing circuit between the input and a point at the output of the preselector, which has a relatively low impedance to ground for the undesired IF frequencies.

These and other objects of this invention will be more clearly understood from the following description taken in connection with the accompanying drawing, and its scope will be apparent from the appended claim.

The drawing is a schematic diagram of the improved UHF converter embodied in this invention.

Referring now to the drawing, a UHF converter is shown having a pair of antenna terminals 11 and 12 connected via a standard 300 ohm transmission line 13 to a pair of input terminals 14 and 15 of a balun 16. The balun 16 consists of a pair of transformers 17 and 18 and functions to connect the balanced transmission line 13 to the unbalanced line of the converter which has one side grounded. The balun 16 also provides an impedance match between the transmission line and the input impedance of the converter. An output terminal 19 of the balun is connected to a shunt capacitor 20 to ground and to a series capacitor 21. The capacitors 20 and 21 are coupling capacitors and are utilized for matching the balun impedance to that of the first tuner circuit of a preselector 24.

The preselector 24 has a double-tuned stage consisting of the tuning elements 25 and 26. The tuning elements 25 and 26 are semi-circular metallic strips spaced a controlled distance from a grounding plate 27. A pair of ganged, wiper arms 28 and 29, which contact the grounding plate 27, act as movable shorting bars for the tuning sections 25 and 26, respectively. Consequently, each tuning section 25 and 26 is actually a short-circuited transmission line whose length may be varied to change the frequency to which it is tuned. The tuning elements 25 and 26 are link coupled by a plurality of loops 30, 33 and 36 which extend through the grounding plate 27 via a plurality of insulators 32. The link 33 is grounded at each end and the loops 30 and 36 are connected to the grounding plate 27 at points 31. The tuning element 25 has input signals coupled thereto through the coupling capacitor 21, to a variable capacitor 22 and a variable inductor 23. The capacitor 22 is a trimmer capacitor used for alignment at the low frequency end of the band. The inductor 23 is a short length of strap conductor which may be adjusted thereby acting as a trimmer inductance for alignment at the high end of the band. The output of the preselector 24 which appears on tuning element 26 is coupled via a variable inductor 34, a variable capacitor 35 and a coupling capacitor 37 to one side of a crystal 39. The variable inductor 34 is a trimmer inductance which is utilized for alignment at the high end of the band, and the variable capacitor 35 is a trimmer capacitor for aligning the low end of the band on the secondary of the preselector. The capacitor 37 couples the output of the secondary of the preselector 24 to the crystal 39 and acts to reduce the loading on the secondary of the preselector. The other side of the crystal 39 is coupled to the output of a UHF oscillator 44. The oscillator 44 may be of conventional type with the only requirements being that it cover the frequency range in question, and that it furnish sufficient power to the crystal to give a useful degree of conversion efficiency. An inductor 40 is connected between the crystal 39 and ground. This inductor consists of a short piece of wire which may be adjusted thereby providing a means for varying the coupling of the oscillator feed to the crystal 39.

By applying the signal frequency to one side of the crystal 39 and the oscillator frequency to the other side, the signals are heterodyned to produce a difference frequency which corresponds to the intermediate frequency (IF) desired. An inductor 38 is coupled to the junction of capacitor 37 and the crystal 39. The inductor 38 is a UHF choke which functions to remove the oscillator voltage from the IF output, and to provide a high impedance for UHF signals. An inductor 42 is connected to the inductor 38 and through a capacitor 45 to ground. A tap 43 is applied to the inductor 42 for obtaining the IF output. The capacitor 45 acts as a blocking capacitor to permit crystal current to be measured during alignment of the converter. A capacitor 41 is connected between the junction of inductors 38 and 42 to by-pass UHF and to tune the inductor 42 to the IF output.

The converter just described functions to reduce the ultra-high frequency signals applied at the antenna terminals to intermediate frequency signals in order to permit UHF reception on VHF television receivers. Antenna radiation of the type previously described is coupled from the UHF oscillator 44 through the crystal 39 and by inductive coupling through the preselector 24 to the balun 16, and consequently to the antenna. In order to reduce this antenna radiation, a neutralizing circuit consisting of a capacitor 47 is connected between points 19 and 46. Neutralization is obtained because the oscillator voltage fed inductively through the preselector is out-of-phase with the oscillator voltage fed by capacitive coupling to the input of the preselector at point 19. The size of the neutralizing capacitor 47 should be carefully chosen to feed back the proper amount of neutralizing voltage at the local oscillator frequency.

The advantage of this invention over the aforesaid application, Serial No. 762,445, now Patent No. 2,921,-189, resides in the connection of the neutralizing circuit to the point 46. In the aforesaid application, the neutralization circuit was connected directly to one side of the crystal. As consequence, undesired IF signals appearing on the antenna could be coupled around the preselector 24 by the capacitor 47 to the IF output terminal 43 thereby interfering with desired IF signals generated by the converter. By connecting the capacitor 47 to point 46, the output of capacitor 47 is shunted to ground via inductor 34 and tuning element 26 thereby providing a low impedance path to ground for the undesired IF signals. With this arrangement, it has been found that the neutralization effectiveness of the tuner of the aforesaid application is not impaired, and furthermore the IF rejection of the circuit embodied in this invention is competitive with that obtained in prior art circuits not employing neutralization.

It should be pointed out that the connection of the neutralizing circuit to the point 46 connects the capacitor 47 to a higher impedance point on the secondary of the preselector 24. Accordingly, more capacitive coupling is provided by the neutralizing circuit which bucks the inductive coupling provided by loops 30, 33 and 36 in preselector 24. Consequently, the inductive coupling provided by these loops should be increased to account for the change in capacitive coupling of the neutralizing network for best results.

What I claim as new and desire to secure by Letters Patent of the United States is:

An ultra-high frequency converter for converting an ultra-high frequency signal to a desired intermediate frequency signal comprising in combination a preselector, a crystal, and an ultra-high frequency oscillator, said preselector having a tuned circuit input and a tuned circuit output which are inductively coupled, said tuned circuit output having a point therein which provides a low-impedance path to ground for intermediate frequency signals, a coupling capacitor connected between said point and said crystal for coupling the output of said preselector to one side of said crystal, said coupling capacitor being of such value as to reduce the loading on said tuned circuit output, means for coupling the output of said oscillator to the other side of said crystal, a capacitor connected between said point and the input of said preselector for coupling a voltage which is out-of-phase with the oscillator voltage inductively coupled through said preselector thereby neutralizing the oscillator voltage at the input of said preselector, a series circuit comprised of a choke coil for ultra-high frequencies and a circuit that is resonant at said intermediate frequency, the said series circuit being connected shunt with said crystal and the said means for coupling the output of said oscillator to said crystal, and an intermediate frequency output terminal coupled to said resonant circuit.

References Cited in the file of this patent

UNITED STATES PATENTS

| | | |
|---|---|---|
| 2,114,615 | Schlessinger | Apr. 19, 1938 |
| 2,760,061 | Pan et al. | Aug. 21, 1956 |
| 2,849,602 | Hesse | Aug. 26, 1958 |

FOREIGN PATENTS

| | | |
|---|---|---|
| 921,273 | Germany | Dec. 13, 1954 |

OTHER REFERENCES

Article: "UHF Television Tuner Local Oscillator Radiation," by Mukai, Institute of Radio Engineers Transactions on Broadcast and Television Receivers, July 1955; pages 44 to 51; vol. BTR-1 No. 3.